US012777742B2

(12) United States Patent
Park et al.

(10) Patent No.: US 12,777,742 B2
(45) Date of Patent: Oct. 27, 2026

(54) POWER SYSTEM BASED ON BETA SOURCE AND METHOD FOR OPERATING THE SAME

(71) Applicant: Electronics and Telecommunications Research Institute, Daejeon (KR)

(72) Inventors: Seong Mo Park, Daejeon (KR); Byounggun Choi, Daejeon (KR); Bon Tae Koo, Daejeon (KR); Young-Su Kwon, Daejeon (KR); Kyung Hwan Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 1098 days.

(21) Appl. No.: 17/848,855

(22) Filed: Jun. 24, 2022

(65) Prior Publication Data

US 2023/0069909 A1 Mar. 9, 2023

(30) Foreign Application Priority Data

Sep. 6, 2021 (KR) ........................ 10-2021-0118471

(51) Int. Cl.
*H01L 31/02* (2006.01)
*G01R 31/382* (2019.01)
*H10F 77/00* (2025.01)

(52) U.S. Cl.
CPC ......... *H10F 77/933* (2025.01); *G01R 31/382* (2019.01); *H10F 77/953* (2025.01)

(58) Field of Classification Search
CPC .... G01R 31/382; G01R 31/3842; G21H 1/06; H02J 7/00
See application file for complete search history.

(56) References Cited

U.S. PATENT DOCUMENTS 5,299,529 A * 4/1994 Ramirez ............. A01K 5/0291 119/51.11
6,479,919 B1 * 11/2002 Aselage .................. G21H 1/02 310/303

(Continued)

FOREIGN PATENT DOCUMENTS

JP 2013-74698 4/2013
KR 10-2013-0091066 8/2013

(Continued)

*Primary Examiner* — Julian D Huffman
*Assistant Examiner* — Sadia Kousar
(74) *Attorney, Agent, or Firm* — KILE PARK REED & HOUTTEMAN PLLC

(57) ABSTRACT

Provided herein are a power system based on a beta source and an operating method thereof. The system includes a power generating section including a plurality of beta source-based generators, a power storage section including a plurality of power storages to store electrical energy which is generated from the generators, a multiplexer configured to select at least some of the storages, an optical power learning section to receive electrical signals provided from the storages, and estimate a state of charge (SOC) of each of the storages, through machine learning, an optimal power selecting section to select a power storage, which provides the optimal power, based on the SOC of each of the storages, an output section including a plurality of output devices to output power provided from the storage selected by the optimal power selecting section, and a de-multiplexer to select at least one output device of the output devices.

13 Claims, 6 Drawing Sheets

(56) References Cited

U.S. PATENT DOCUMENTS

| | | | | |
|---|---|---|---|---|
| 8,682,517 | B2 * | 3/2014 | Iida | H02J 7/1423<br>290/40 C |
| 8,972,470 | B2 | 3/2015 | Park et al. | |
| 9,032,005 | B2 | 5/2015 | Park et al. | |
| 9,172,258 | B2 | 10/2015 | Song | |
| 10,283,974 | B2 * | 5/2019 | Macris | G01R 31/3842 |
| 10,811,880 | B2 | 10/2020 | Kim et al. | |
| 2013/0200852 | A1 * | 8/2013 | Song | H02J 7/0016<br>320/134 |
| 2015/0349387 | A1 * | 12/2015 | Inaba | G05B 15/02<br>700/297 |
| 2020/0076223 | A1 | 3/2020 | Kuriki et al. | |
| 2023/0071975 | A1 * | 3/2023 | Singer | B60L 58/13 |

FOREIGN PATENT DOCUMENTS

| | | | | |
|---|---|---|---|---|
| KR | 10-2015-0047181 | | 5/2015 | |
| KR | 10-2017-0079677 | | 7/2017 | |
| KR | 10-2019-0023952 | | 3/2019 | |
| KR | 20190023952 | A * | 3/2019 | G06Q 50/06 |
| KR | 10-2017599 | | 9/2019 | |
| KR | 10-2189883 | | 12/2020 | |

* cited by examiner

POWER SYSTEM BASED ON BETA SOURCE AND METHOD FOR OPERATING THE SAME

CROSS-REFERENCE TO RELATED APPLICATIONS

This application claims priority under 35 U.S.C. § 119 to Korean Patent Application No. 10-2021-0118471 filed on Sep. 6, 2021, in the Korean Intellectual Property Office, the disclosures of which are incorporated by reference herein in their entireties.

BACKGROUND

Embodiments of the present disclosure described herein relate to a power control technology, and more particularly, relate to a power system based on a beta source and a method of operating the same.

Recently, services based on various wireless communication and portable devices have become common. However, supplying of power necessary for the operation of a device depends on the existing chemical cell or physical cell, and the use of the chemical cell or physical cell causes limitations in operation time and inconvenience and limitations caused by replacement or charging of the battery. To overcome such limitations, a beta cell using beta rays emitted from a radioactive isotope has been proposed. The beta cell produces electrical energy by absorbing the beta ray emitted from a beta emitter, such as an isotope, into a PN junction layer of a semiconductor.

The beta cell autonomously produces power without an external power source without an influence by the change of a surrounding environment and an external power source. In addition, the beta cell may be employed semi-permanently, because the battery life extends, when an isotope with a longer half-life is employed. Due to the advantages, the beta cell has been employed as a breakthrough solution for power problems of devices implemented under extreme environments, such as a deep sea, a space, or a polar region, making it difficult to charge power and making it difficult for a human being to access, or sensors used in a bridge, a dam, or a tunnel making it difficult to replace a battery, after the battery has been installed once. However, since the beta cell supplies only micro-power, the power efficiency provided by the system based on the beta cell is lower than that of the system based on a chemical cell or a physical cell.

SUMMARY

Embodiments of the present disclosure provide a beta source-based low power system provided therein with artificial intelligence and a method for operating the same.

According to an embodiment, a power system based on a beta source includes a power generating section including a plurality of beta source-based generators, a power storage section including a plurality of power storages to store electrical energy generated from the plurality of beta source-based generators, a multiplexer to select at least some of the plurality of power storages, an optical power learning section to receive electrical signals provided from the plurality of power storages, and estimate a state of charge (SOC) of each of the plurality of power storages, through machine learning, an optimal power selecting section to select a power storage, which provides the optimal power, based on the SOC of each of the plurality of power storages, an output section including a plurality of output devices to output power provided from the power storage selected by the optimal power selecting section, and a de-multiplexer to select at least one output device of the plurality of output devices.

For example, the optimal power learning section includes an input module to sense a voltage value or a current value from the electrical signals, a pre-processing module to receive the voltage value or the current value from the input module and transform the voltage value or the current value to input data for machine learning, a neuron array module to estimate the SOC of each of the plurality of power storages through the machine learning based on a digital signal obtained from the pre-processing module, a memory to store a weight value for an operation of the machine learning, and to provide the weight value to the neuron array module, and an optimal power classifying module to classify the power storage providing the optimal power, based on the estimated SOC.

For example, the pre-processing module includes an analog/digital converter to convert the voltage value or the current value into the digital signal, and a standardization unit to standardize the digital signal with a specific bit number to generate the input data.

For example, the specific bit number is '8'.

For example, the neuron array module includes an input buffer to store the input data, a weight buffer to store the weight value provided from the memory, a multiplier to perform a multiplication operation with respect to the input data provided from the input buffer and the weight data provided from the weight buffer, an adder to perform an add operation with respect to a result value of the multiplication operation derived from the multiplier, and a register to temporarily store a result of the add operation, which is provided from the adder.

For example, the optimal power classifying module includes a clock generating unit to generate a clock signal, a random number vector calculating unit to receive the clock signal and a true random number and perform a calculation, a distance calculating unit to receive a result of the calculation from the random number vector calculating unit, the input data, and the clock signal, and perform a calculation, a classifying unit to classify a power storage, which provides the optimal power, of the plurality of power storages, as an optimal power providing unit, based on a calculation result derived from the distance calculating unit, and a determining unit to determine whether a power value, which is provided by the power storage classified, by the classifying unit, as the optimal power providing unit, is equal to or greater than a threshold value For example, the plurality of output devices are Internet of thing (IoT) sensors.

For example, the machine learning is based on at least one of Forward Neural Network (FNN), Decision Tree Learning, Support Vector Machine, a Genetic algorithm, an Artificial Neural Network (ANN), a Convolutional Neural Network (CNN), a Recurrent Neural Network (RNN), Reinforcement Learning, or Auto Encoder.

According to an embodiment of the present disclosure, a method for operating a power system based on a beta source, includes sensing a voltage value or a current value from each of a plurality of power storages to store electrical energy, based on the beta source, pre-processing the sensed voltage value or the sensed current value, estimating an SOC of each of the plurality of power storages, from the pre-processed voltage value or the pre-processed current value through machine learning, to select an optimal power device based on the SOC, determining whether a power value, which is provided from the optimal power device, is equal to or greater than a preset threshold value, and outputting the power value, when the power value provided from the optimal power device is equal to or greater than the preset threshold value.

For example, the machine learning is based on at least one of Forward Neural Network (FNN), Decision Tree Learning, Support Vector Machine, a Genetic algorithm, an Artificial Neural Network (ANN), a Convolutional Neural Network (CNN), a Recurrent Neural Network (RNN), Reinforcement Learning, or Auto Encoder.

For example, the method further includes selecting some output devices of a plurality of output devices included in the power system based on the beta source.

For example, the pre-processing of the sensed voltage value or the sensed current value includes converting the sensed voltage value or the sensed current value in a form of a digital signal, and standardizing the digital signal with a specific bit number.

For example, the specific bit number is '8'.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
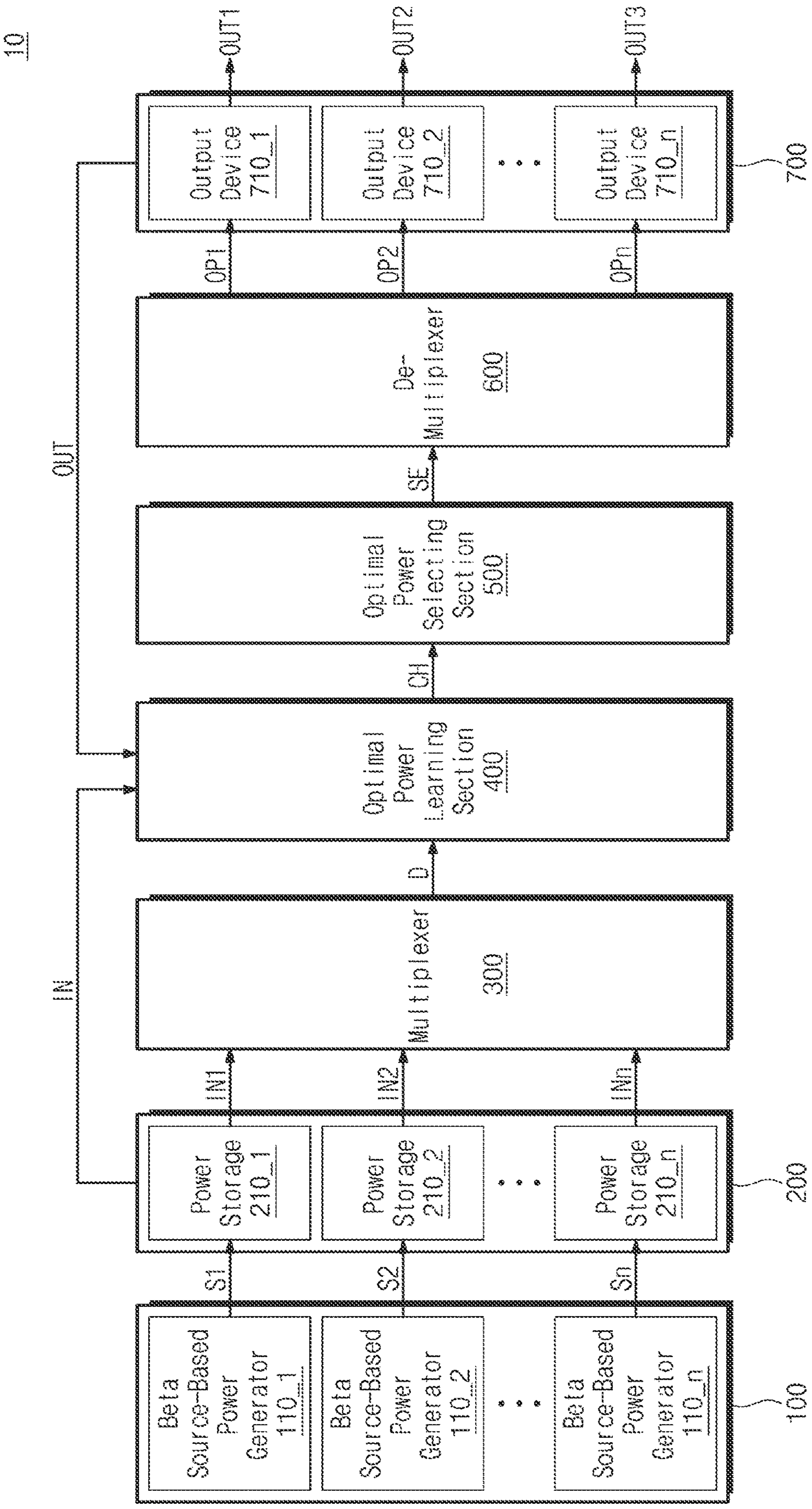
FIG. 1 is a block diagram schematically illustrating a beta source-based power system, according to an embodiment of the present disclosure.

Hereinafter, embodiments of the present disclosure will be described in detail and clearly such that those skilled in the art easily reproduce the present disclosure.

The terms used in the specification are provided to describe the embodiments, not to limit the present disclosure. As used in the specification, the singular terms "a," "an" and "the" are intended to include the plural forms as well, unless the context clearly indicates otherwise. The terms "comprises" and/or "comprising," when used in the specification, specify the presence of components, steps, operations, and/or elements, but do not preclude the presence or addition of one or more other components, steps, operations, and/or elements.

In the specification, the term "first and/or second" will be used to describe various elements but will be described only for the purpose of distinguishing one element from another element, not limiting an element of the corresponding term. For example, without departing from the scope and spirit of the present disclosure, a first element may be referred to as a second element, and similarly, a second element may be referred to as a first element.

Unless otherwise defined, all terms (including technical and scientific terms) used in the specification should have the same meaning as commonly understood by those skilled in the art to which the present disclosure pertains. Also, the terms that are defined in commonly used dictionaries should not be interpreted in an idealized or overly formal sense unless expressly so defined herein. The same reference numerals represent the same elements throughout the specification.

FIG. 1 is a block diagram schematically illustrating a beta source-based power system 10 based on a beta source, according to an embodiment of the present disclosure. Referring to FIG. 1, the beta source-based power system 10 may include a beta source-based power generating section 100, a power storage section 200, a multiplexer 300, an optimal power learning section 400, an optimal power selecting section 500, a de-multiplexer 600, and an output section 700.

The beta source-based power generating section 100 includes a plurality of beta source-based power generators 110_1, 110_2, . . . , and **110_*n*. For example, each of the plurality of beta source-based power generators 110_1, 110_2, . . . , and 110_*n* may be a beta cell. Power S1, S2, . . . , and Sn generated from the beta source-based power generators 110_1, 110_2, . . . , and 110_*n*, respectively, may be stored in the power storage section 200**.

The power storage section 200 may include a plurality of power storages 210_1, 210_2, . . . , and **210_*n*. The plurality of power storages 210_1, 210_2, . . . , and 210_*n* may store the power S1, S2, . . . , and Sn, which are generated from the beta source-based power generators 110_1, 110_2, . . . , and 110_*n*, respectively, in the form of electrical energy. The power storage section 200 may provide the power, which is provided from each of the plurality of power storages 210_1, 210_2, . . . , and 210_*n*, as an input IN to the optimal power learning section 400. In addition, the power storage section 200 may provide the power, which is provided from each of the plurality of power storages 210_1, 210_2, . . . , and 210_*n*, as each of inputs IN1, IN2, . . . , and INn to the multiplexer 300**.

The multiplexer 300 may extract the optimal power of power supplied from the plurality of power storages 210_1, 210_2, . . . , and **210_*n* of the power storage section 200. The optimal power extracted from the multiplexer 300 may be determined, based on operation results of the optimal power learning section 400 and the optimal power selecting section 500. The multiplexer 300 may provide data D corresponding to the extracted optimal power to the optimal power learning section 400**.

The optimal power learning section 400 may perform learning for the optimal power through machine learning. A machine learning model used by optimal power learning sections 400 may include at least one of Forward Neural Network (FNN), Decision Tree Learning, Support Vector Machine, a genetic algorithm, an artificial neural network (ANN), a convolutional neural network (CNN), a recurrent neural network (RNN), Reinforcement Learning, or Auto Encoder.

The optimal power learning section 400 may estimate a state of charge (SoC) of the power storage section 200, based on the input IN, which is power provided from the plurality of power storages 210_1, 210_2, . . . , and **210_*n* of the power storage section 200, to the optimal power learning section 400, and may provide a classification result CH based on the estimated result to the optimal power selecting section 500. The detailed configuration and operation of the optimal power learning section 400 will be described with reference to FIGS. 2 and 3**.

The optimal power selecting section 500 may select a power storage, which provides the optimal power, of the plurality of power storages 210_1, 210_2, . . . , and **210_*n*, which are included in the power storage section 200, based on the classification result CH, which is obtained from the result estimated by the optimal power learning section 400. The optimal power selecting section 500 may provide power SE, which is obtained from the power storage to provide the optimal power, to the de-multiplexer 600**.

The de-multiplexer 600 may select at least one of a plurality of output devices 710_1, 710_2, . . . , and **710_*n* included in the output section 700. The de-multiplexer 600 may provide the optimal power, which is selected by the optimal power selecting section 500, to at least one output device which is selected. For example, when the de-multiplexer 600 selects the first output devices 710_1, the optimal power selecting section 500 may provide at least a portion OP_1 of the power SE, which is obtained from the power storage to provide the optimal power, to the first output devices 710_1. For example, the plurality of output devices 710_1, 710_2, . . . , and 710_*n*** may be Internet of Thing (IoT) sensors to collect, store, and analyze data in the system.

The beta source-based power system 10 according to the present disclosure may achieve optimal power efficiency by deriving the optimal power through machine learning in a beta source-based system to provide micro-power. In addition, the beta source-based power system 10 may supply semi-permanent power without an external power source, thereby improving the system reliability.

Figure 2:
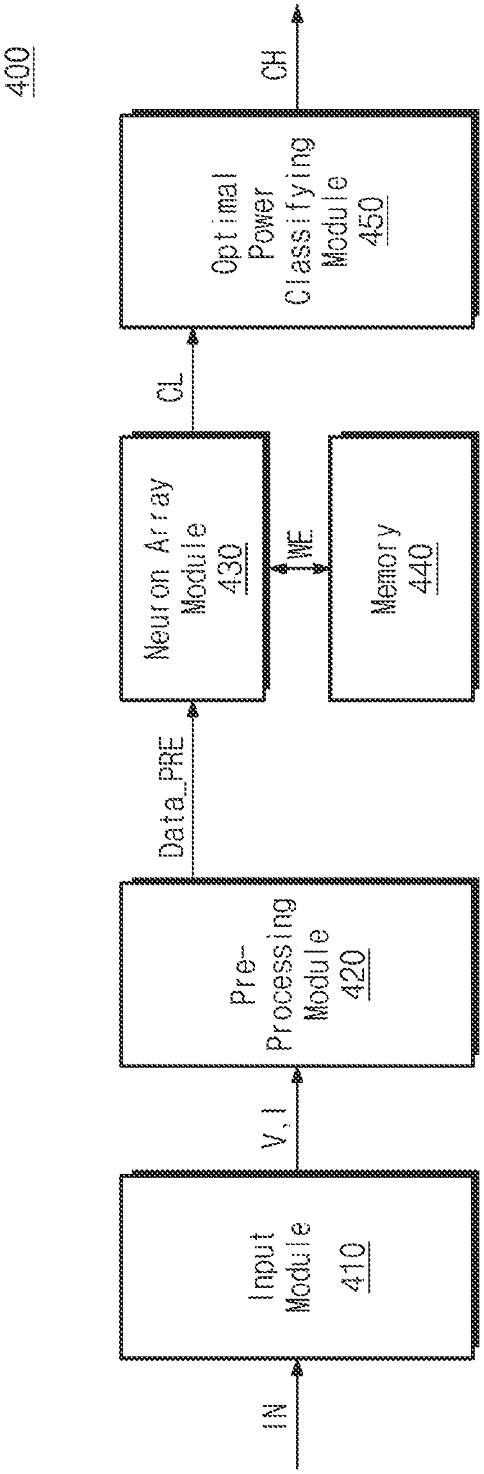
FIG. 2 is a view illustrating a detailed configuration of the optimal power learning section illustrated in FIG. 1.

FIG. 2 is a view illustrating a detailed configuration of the optimal power learning section 400 illustrated in FIG. 1. The optimal power learning section 400 may include an input module 410, a pre-processing module 420, a neuron array module 430, a memory 440, and an optimal power classifying module 450.

The input module 410 may receive the power, which is supplied from the plurality of power storages 210_1, 210_2, . . . , and **210_*n* of the power storage section 200, as the input IN. Although not illustrated, the input module 410 may include a voltage sensor or a current sensor. The input module 410 may receive the power provided from the power storage section 200 as the input IN, and may output a voltage value 'V' or a current value 'I', which is sensed by the voltage sensor or the current sensor, to the pre-processing module 420**.

The pre-processing module 420 may receive the voltage value 'V' or the current value T from the input module 410 and may perform a pre-processing operation for the voltage value 'V' or the current value 'I'. The pre-processing operation refers to an operation of transforming the voltage value 'V' or the current value T into data of a format suitable for the machine learning of the optimal power learning section 400. The pre-processing module 420 may generate pre-processed data Data_PRE through the pre-processing operation and may provide the pre-processed data Data_PRE to the neuron array module 430. The detailed configuration and operation of the pre-processing module 420 will be described in more detail with reference to FIG. 4.

The neuron array module 430 may receive the pre-processed data Data_PRE from the pre-processing module 420 and may receive a weight value WE, which is used for the machine learning, from the memory 440. The neuron array module 430 may estimate a SOC state CL from the pre-processed data Data_PRE, based on the pre-processed data Data_PRE and the weight value WE, and may provide the estimated SOC state CL to the optimal power classifying module 450. The detailed configuration and operation of the neuron array module 430 will be described later in more detail with reference to FIG. 5.

The memory 440 may store the weight value WE used for a machine learning operation, and may provide the stored weight value WE to the neuron array module 430. In addition, the memory 440 may update the weight value WE used for the machine learning operation, based on the machine learning result of the neuron array module 430. The memory 440 may store an updated weight value WE provided from the neuron array module 430.

The optimal power classifying module 450 may perform a classification operation for an optimal power value, based on the SOC state CL provided from the neuron array module 430. For example, the optimal power classifying module 450 may classify, as the optimal power, a power value, which is equal to or greater than a threshold value, through comparison with a predetermined threshold value. The optimal power classifying module 450 may provide a classification result CH to the optimal power selecting section 500. The detailed configuration and operation of the optimal power classifying module 450 will be described later in more detail with reference to FIG. 6.

Figure 3:
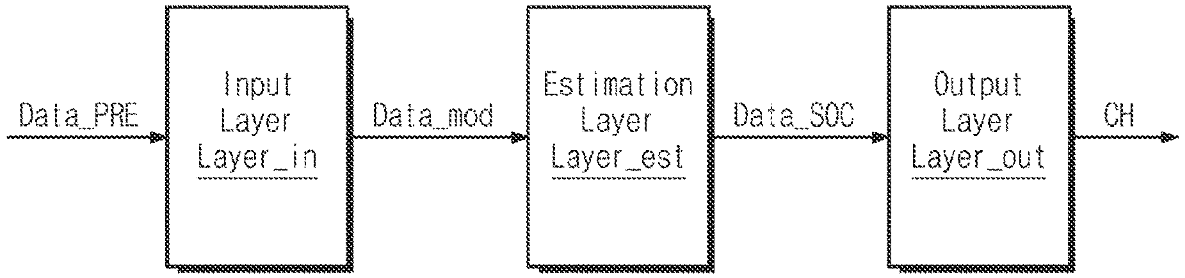
FIG. 3 is a view illustrating an operation of an optimal power learning section illustrated in FIG. 1.

FIG. 3 is a view illustrating an operation of the optimal power learning section 400 (see FIG. 1) illustrated in FIG. 1. As described above, the optimal power learning section 400 in the beta source-based power system 10 according to the present disclosure may perform machine learning, based on at least one of Forward Neural Network (FNN), Decision Tree Learning, Support Vector Machine, a genetic algorithm, an artificial neural network (ANN), a convolutional neural network (CNN), a recurrent neural network (RNN), Reinforcement Learning, or Auto Encoder. To estimate the SOC of each of the plurality of storages 210_1, 210_2, . . . , and **210_*n* included in the power storage section 200 (see FIG. 1), through machine learning, the optimal power learning section 400** may include an input layer Layer_in, an estimation layer Layer_est, and an output layer Layer_out to perform the machine learning.

The input layer Layer_in may receive pre-processed data Data_PRE received from the pre-processing module 420 (see FIG. 2). The input layer Layer_in may modify the format of the pre-processed data Data_PRE received to be matched to the estimation layer Layer_est. The input layer Layer_in may provide the data Data_mod having a modified format, to the estimation layer Layer_est.

The estimation layer Layer_est may estimate the SOC of each of the plurality of storages 210_1, 210_2, . . . , and **210_*n* included in the power storage section 200**, through machine learning using the data Data_mod having a modified format. The estimation layer Layer_est may provide SOC data Data_SOC including the estimated SOC information to the output layer Layer_out.

The output layer Layer_out may perform a classification to obtain the optimal power value based on the SOC data Data_SOC. The output layer Layer_out may output the result CH for the classified optimal power value.

Figure 4:
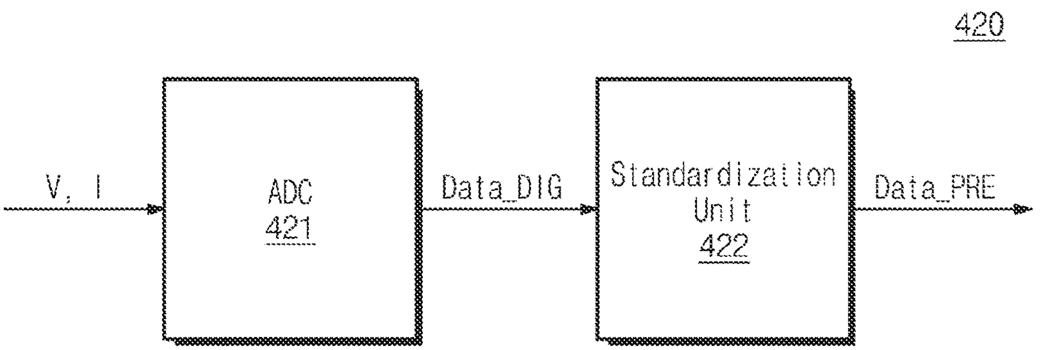
FIG. 4 is a view illustrating a detailed configuration of a pre-processing module illustrated in FIG. 2.

FIG. 4 is a view illustrating a detailed configuration of the pre-processing module 420 illustrated in FIG. 2. Referring to FIG. 4, the pre-processing module 420 may include an analog/digital converter (ADC) 421 and a standardization unit 422.

The ADC 421 may convert the voltage value 'V' or the current value T, which has the form of an analog signal provided from the input module 410 (see FIG. 2), into digital data. The ADC 421 may provide the converted digital data Data_DIG to the standardization unit 422.

The standardization unit 422 may standardize the digital data Data_DIG provided from the ADC 421 with a specific bit value. The standardization unit 422 may generate input data optimized for the machine learning through the standardization of the digital data Data_DIG. For example, the standardization unit 422 of the beta source-based power system 10 (see FIG. 1) according to an embodiment of the present disclosure may standardize the digital data Data_DIG as an 8-bit value. The standardization unit 422 may output standardized data as the pre-processed data Data_PRE, as a result of the pre-processing operation.

Figure 5:
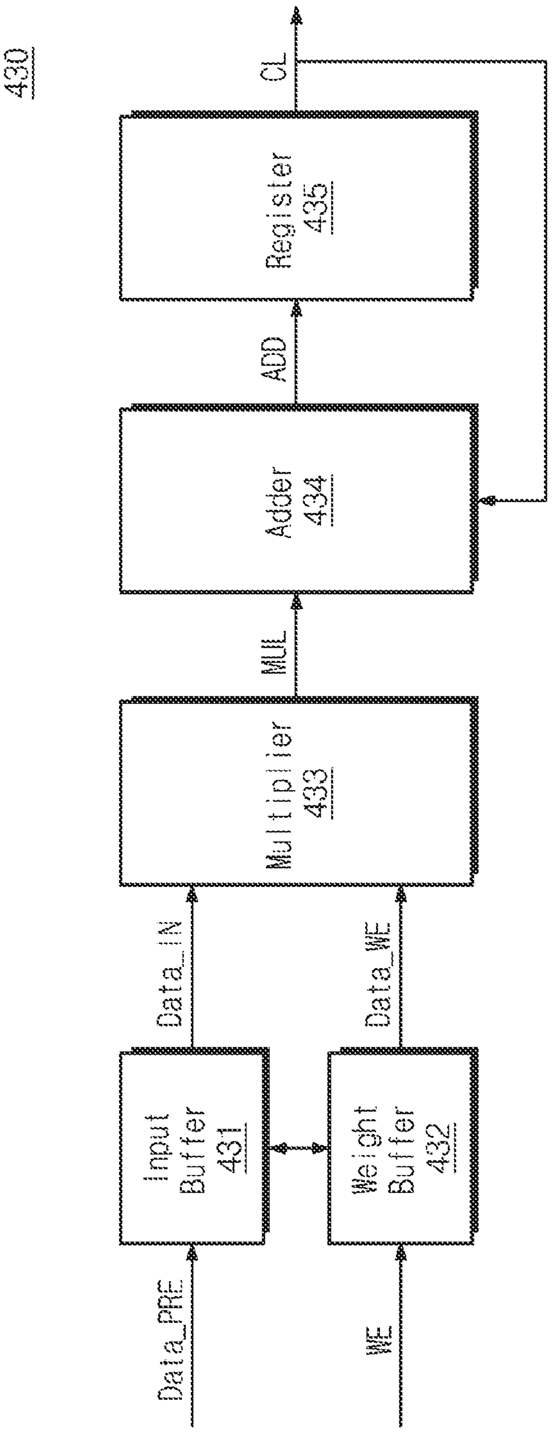
FIG. 5 is a view illustrating a detailed configuration of the neuron array module illustrated in FIG. 2.

FIG. 5 is a view illustrating a detailed configuration of the neuron array module 430 illustrated in FIG. 2. Referring to FIG. 5, the neuron array module 430 may include an input buffer 431, a weight buffer 432, a multiplier 433, an adder 434, and a register 435.

The input buffer 431 may store the pre-processed data Data_PRE provided from the pre-processing module 420 (see FIG. 2). The weight buffer 432 may store the weight value WE provided from the memory 440 (see FIG. 2). The input buffer 431 may provide input data Data_IN to the multiplier 433, based on the stored pre-processed data Data_PRE, and the weight buffer 432 may provide weight data Data_WE to the multiplier 433, based on the stored weight value WE.

The multiplier 433 may perform a multiplication operation with respect to the input data Data_IN, which is provided from the input buffer 431, and the weight data Data_WE which is provided from the weight buffer 432. The multiplier 433 may provide a result MUL of the multiplication operation for the input data Data_IN and the weight data Data_WE, to the adder 434. The adder 434 may perform an add operation with respect to the result MUL of the multiplication operation provided from the multiplier 433. The adder 434 may provide a result ADD of the addition operation, to the register 435.

The register 435 may temporarily store the result ADD of the add operation provided from the adder 434. In addition, the register 435 may output the SOC state CL based on the operation results of the multiplier 433 and the adder 434. In addition, the register 435 may feedback the operation results of the multiplier 433 and the adder 434, to the adder 434 to update a variable used in the machine learning operation.

Figure 6:
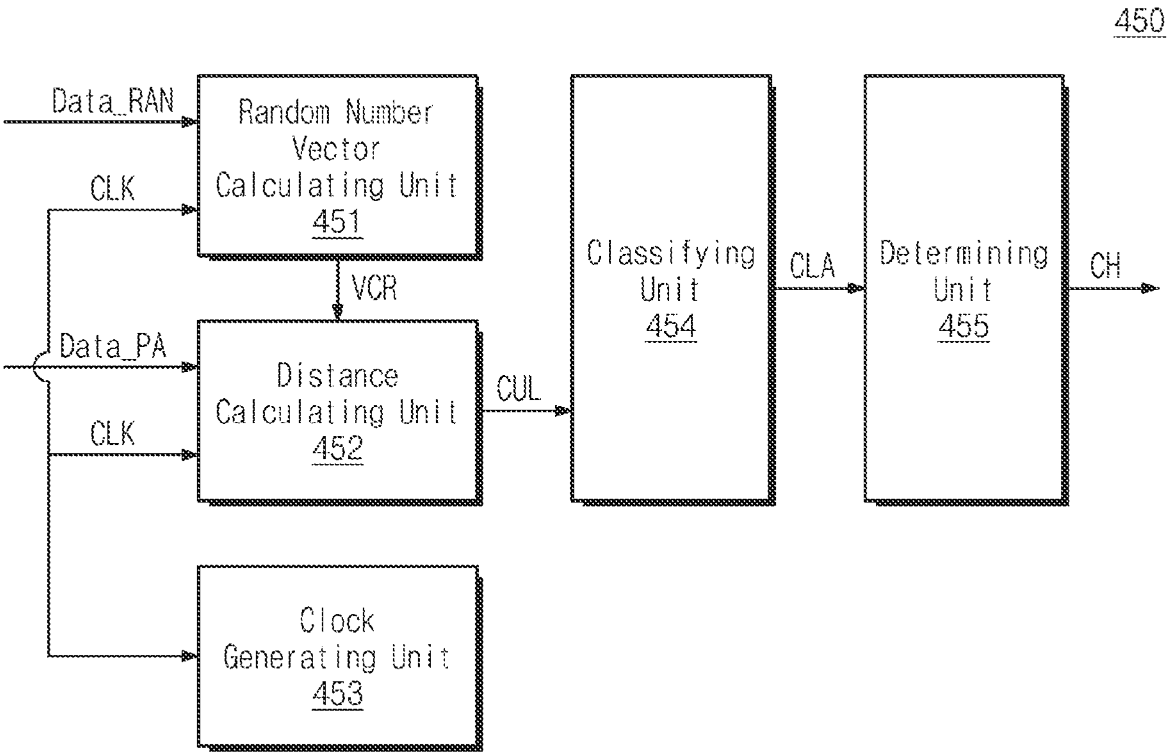
FIG. 6 is a view illustrating a detailed configuration of an optimal power classifying module illustrated in FIG. 2.

FIG. 6 is a view illustrating a detailed configuration of the optimal power classifying module 450 illustrated in FIG. 2. Referring to FIG. 6, the optimal power classifying module 450 may include a random number vector calculating unit 451, a distance calculating unit 452, a clock generating unit 453, a classifying unit 454, and a determining unit 455.

The random number vector calculating unit 451 may receive random data Data_RAN and a clock signal CLK, which is generated from the clock generating unit 453, and may calculate a random number vector. In the initial operation, the random data Data_RAN may include an arbitrary random number. After the initial operation, the random data Data_RAN may be provided, based on the result of the machine learning operation. The random number vector calculating unit 451 may provide a calculation result VCR to the distance calculating unit 452.

The distance calculating unit 452 may receive a parameter data Data_PA, the calculation result VCR provided by the random number vector calculating unit 451, and the clock signal CLK generated from the clock generating unit 453. The distance calculating unit 452 may provide a distance calculation result CUL based on the parameter data Data_PA, the calculation result VCR, and the clock signal CLK, to the classifying unit 454.

The classifying unit 454 may classify the plurality of power storages 210_1, 210_2, . . . , and **210_*n* (see FIG. 1) based on the distance calculation result CUL, to obtain the power storage which provides the optimal power. The classifying unit 454 may provide a classification result CLA to the determining unit 455**.

The determining unit 455 may compare a power value, which is provided by the power storage classified as providing the optimal power, with a preset threshold value, based on the classification result CLA of the classifying unit 454. The determining unit 455 may provide, to the optimal power selecting section 500 (see FIG. 1), the classification result CH including information on the power storage having a power value equal to or greater than the threshold value.

Figure 7:
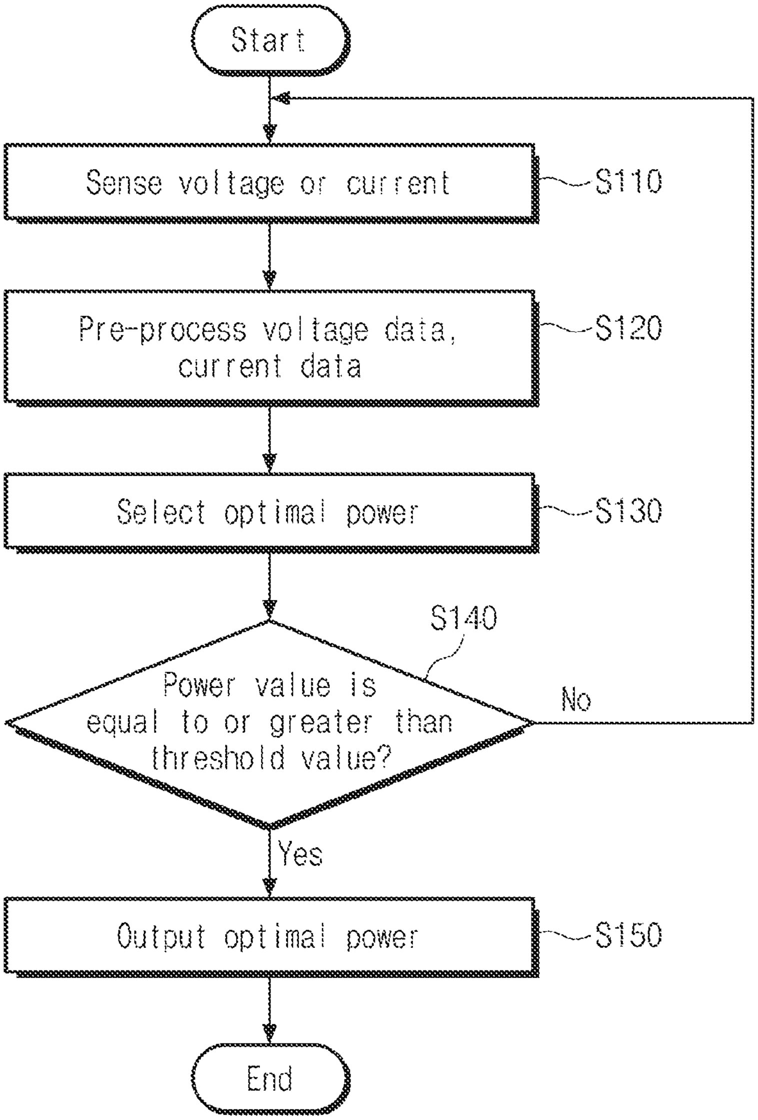
FIG. 7 is a flowchart illustrating a method for operating a beta source-based power system according to an embodiment of the present disclosure.

FIG. 7 is a flowchart illustrating a method for operating the beta source-based power system 10 (see FIG. 1) according to an embodiment of the present disclosure. Hereinafter, the duplication of the configuration and the operation described above will be omitted.

In step S110, the input module 410 (see FIG. 2) of the beta source-based power system 10 may sense the voltage value 'V' (see FIG. 2) or the current value T (see FIG. 2), based on power provided from the plurality of power storages 210_1, 210_2, . . . , and **210_*n* (see FIG. 1) of the power storage section 200 (see FIG. 1). The input module 410 may provide the sensed voltage value 'V' or the sensed current value 'I' to the pre-processing module 420 (see FIG. 2**).

In step S120, the pre-processing module 420 may perform the pre-processing operation of converting the voltage value 'V' or the current value 'I', which is the analog signal, into the digital signal and standardize the digital signal with a preset bit number. The pre-processing module 420 may provide the pre-processed data Data_PRE (see FIG. 1) to the neuron array module 430 (se FIG. 2).

In step S130, the beta source-based power system 10 may derive the optimal power based on the machine learning operation. Specifically, the neuron array module 430 of the beta source-based power system 10 may estimate the SOC of each of the plurality of power storages 210_1, 210_2, . . . , and **210_*n*** through the machine learning operation, and may select an optimal power device, based on the estimated SOC.

In step S140, the optimal power classifying module 450 (see FIG. 2) of the beta source-based power system 10 may compare a preset threshold value with a power value provided by the optimal power device which is selected. When the power value is less than the threshold value, the beta source-based power system 10 may return to step S110 and perform following operations. Meanwhile, when the power value is equal to or greater than the threshold value, the beta source-based power system 10 may perform the procedure in step S150.

In step S150, the beta source-based power system 10 may provide the power value, which is provided by the selected optimal power device, to the output section 700 (see FIG. 1). The output section 700 may include the plurality of output devices 710_1, 710_2, . . . , and **710_*n*, and the selected optimal power value may be a plurality of output devices 710_1, 710_2, . . . , and 710_*n***. Thereafter, the procedure is terminated.

According to the beta source-based power system and the method for operating the system of the present disclosure, the power system may make the optimal power consumption, and the system reliability may be improved.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. Accordingly, the scope of the present disclosure is not limited to the above-described embodiments, but defined by following claims and equivalents thereof.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A power system based on a beta source, the power system comprising:

a power generating section including a plurality of beta source-based generators, each of the plurality of beta source-based generators being a beta cell configured to convert energy of absorbed beta particles emitted from the beta source directly into electrical energy via one or more semiconductor junctions;

a power storage section including a plurality of power storages to store the electrical energy, which is generated from the plurality of beta source-based generators, the plurality of power storages being configured to provide electrical signals corresponding to power stored in the plurality of power storages;

a multiplexer configured to select at least some of the plurality of power storages, to receive inputs respectively corresponding to power provided from the plurality of power storages, and to provide data corresponding to extracted optimal power;

an optimal power learning section configured to receive electrical signals provided from the plurality of power storages and the data corresponding to the extracted optimal power to estimate a state of charge (SOC) of each of the plurality of power storages, through machine learning;

an optimal power selecting section configured to select a power storage, which provides the optimal power, based on the SOC of each of the plurality of power storages and to provide power obtained from the selected power storage as selected power;

an output section including a plurality of output devices to output power provided from the power storage selected by the optimal power selecting section; and a de-multiplexer configured to select at least one output device of the plurality of output devices and to provide at least a portion of the selected power to the at least one selected output device.

2. The power system of claim 1, wherein the optimal power learning section includes:

an input module to sense a voltage value or a current value from the electrical signals;

a pre-processing module to receive the voltage value or the current value from the input module and transform the voltage value or the current value to input data for the machine learning;

a neuron array module to estimate the SOC of each of the plurality of power storages through the machine learning, based on a digital signal obtained from the pre-processing module;

a memory to store a weight value for an operation of the machine learning, and provide the weight value to the neuron array module; and an optimal power classifying module to classify the power storage which provides the optimal power, based on the estimated SOC.

3. The power system of claim 2, wherein the pre-processing module includes:

an analog/digital converter to convert the voltage value or the current value into the digital signal; and a standardization unit to standardize the digital signal with a specific bit number to generate the input data.

4. The power system of claim 3, wherein the specific bit number is '8'.

5. The power system of claim 2, wherein the neuron array module includes:

an input buffer to store the input data;

a weight buffer to store the weight value provided from the memory;

a multiplier to perform a multiplication operation with respect to the input data provided from the input buffer and the weight data provided from the weight buffer;

an adder to perform an add operation with respect to a result value of the multiplication operation derived from the multiplier; and a register to temporarily store a result of the add operation, which is provided from the adder.

6. The power system of claim 1, wherein the plurality of output devices are Internet of thing (IoT) sensors.

7. The power system of claim 1, wherein the machine learning is based on at least one of Forward Neural Network (FNN), Decision Tree Learning, Support Vector Machine, a Genetic algorithm, an Artificial Neural Network (ANN), a Convolutional Neural Network (CNN), a Recurrent Neural Network (RNN), Reinforcement Learning, or Auto Encoder.

8. A method for operating a power system based on a beta source, the beta source being a beta cell, the method comprising:

converting energy of absorbed beta particles emitted from the beta cell directly into electrical energy via one or more semiconductor junctions;

storing the electrical energy via a plurality of power storages;

sensing a voltage value or a current value from each of the plurality of power storages, which are configured to provide electrical signals corresponding to power stored in the plurality of power storages;

pre-processing the sensed voltage value or the sensed current value;

receiving, at a multiplexer, inputs respectively corresponding to power provided from the plurality of power storages;

selecting, by the multiplexer, at least some of the plurality of power storages;

extracting, by the multiplexer, optimal power and providing data corresponding to the extracted optimal power;

estimating a state of charge (SOC) of each of the plurality of power storages, from the pre-processed voltage value or the pre-processed current value through machine learning, based on (i) the electrical signals provided from the plurality of power storages and (ii) the data corresponding to the extracted optimal power, to select an optimal power storage based on the SOC;

providing power obtained from the optimal power storage as selected power;

determining whether a power value provided from the optimal power storage is equal to or greater than a preset threshold value;

outputting the power value in response to the power value provided from the optimal power storage being equal to or greater than the preset threshold value via an output section including a plurality of output devices; and selecting, by a de-multiplexer, at least one output device among the plurality of output devices and providing at least the portion of the selected power to the at least one selected output device.

9. The method of claim 8, wherein the machine learning is based on at least one of Forward Neural Network (FNN), Decision Tree Learning, Support Vector Machine, a Genetic algorithm, an Artificial Neural Network (ANN), a Convolutional Neural Network (CNN), a Recurrent Neural Network (RNN), Reinforcement Learning, or Auto Encoder.

10. The method of claim 8, wherein selecting the at least one output device among the plurality of output devices included in the power system is based on the beta cell.

11. The method of claim 8, wherein the pre-processing of the sensed voltage value or the sensed current value includes:

converting the sensed voltage value or the sensed current value in a form of a digital signal; and standardizing the digital signal with a specific bit number.

12. The method of claim 11, wherein the specific bit number is '8'.

13. A power system based on a beta source, the power system comprising:

a power generating section including a plurality of beta source-based generators that convert energy of absorbed beta particles emitted from the beta source directly into electrical energy via one or more semiconductor junctions;

a power storage section including a plurality of power storages to store the electrical energy, which is generated from the plurality of beta source-based generators;

a multiplexer configured to select at least some of the plurality of power storages;

an optimal power learning section configured to receive electrical signals provided from the plurality of power storages, and estimate a state of charge (SOC) of each of the plurality of power storages, through machine learning;

an optimal power selecting section configured to select a power storage, which provides the optimal power, based on the SOC of each of the plurality of power storages;

an output section including a plurality of output devices to output power provided from the power storage selected by the optimal power selecting section; and a de-multiplexer configured to select at least one output device of the plurality of output devices, wherein the optimal power learning section includes:

an input module to sense a voltage value or a current value from the electrical signals;

a pre-processing module to receive the voltage value or the current value from the input module and transform the voltage value or the current value to input data for the machine learning;

a neuron array module to estimate the SOC of each of the plurality of power storages through the machine learning, based on a digital signal obtained from the pre-processing module;

a memory to store a weight value for an operation of the machine learning, and provide the weight value to the neuron array module; and an optimal power classifying module to classify the power storage which provides the optimal power, based on the estimated SOC, and wherein the optimal power classifying module includes:

a clock generating unit to generate a clock signal;

a random number vector calculating unit to receive the clock signal and a true random number and perform a calculation;

a distance calculating unit to receive a result of the calculation from the random number vector calculating unit, the input data, and the clock signal, and perform a calculation;

a classifying unit to classify a power storage, which provides the optimal power, of the plurality of power storages, as an optimal power providing unit, based on a calculation result derived from the distance calculating unit; and a determining unit to determine whether a power value, which is provided by the power storage classified, by the classifying unit, as the optimal power providing unit, is equal to or greater than a threshold value.

* * * * *